April 27, 1965 H. P. BROWER ETAL 3,181,082

OSCILLATOR HAVING REMOTELY SITUATED CRYSTAL CONNECTED TO REMAINING CIRCUITRY BY TRANSMISSION LINES SUBSTANTIALLY n/2 WAVELENGTHS WITH RESPECT TO SAID CRYSTAL FREQUENCY

Filed Oct. 8, 1962 3 Sheets-Sheet 1

INVENTORS
HARLEY P. BROWER
MARVIN E. FRERKING

BY Mosly and Harris

ATTORNEYS

INVENTORS
HARLEY P. BROWER
MARVIN E. FRERKING
BY Moody and Harris
ATTORNEYS

April 27, 1965

H. P. BROWER ETAL 3,181,082

OSCILLATOR HAVING REMOTELY SITUATED CRYSTAL CONNECTED TO REMAINING CIRCUITRY BY TRANSMISSION LINES SUBSTANTIALLY n/2 WAVELENGTHS WITH RESPECT TO SAID CRYSTAL FREQUENCY

Filed Oct. 8, 1962

3 Sheets-Sheet 3

INVENTORS
HARLEY P. BROWER
MARVIN E. FRERKING

BY Moody and Harris

ATTORNEYS

United States Patent Office 3,181,082
Patented Apr. 27, 1965

3,181,082
OSCILLATOR HAVING REMOTELY SITUATED CRYSTAL CONNECTED TO REMAINING CIRCUITRY BY TRANSMISSION LINES SUBSTANTIALLY $n/2$ WAVELENGTHS WITH RESPECT TO SAID CRYSTAL FREQUENCY

Harley P. Brower and Marvin E. Frerking, Cedar Rapids, Iowa, assignors to Collins Radio Company, Cedar Rapids, Iowa, a corporation of Iowa Filed Oct. 8, 1962, Ser. No. 229,078
4 Claims. (Cl. 331—49)

Figure 1:
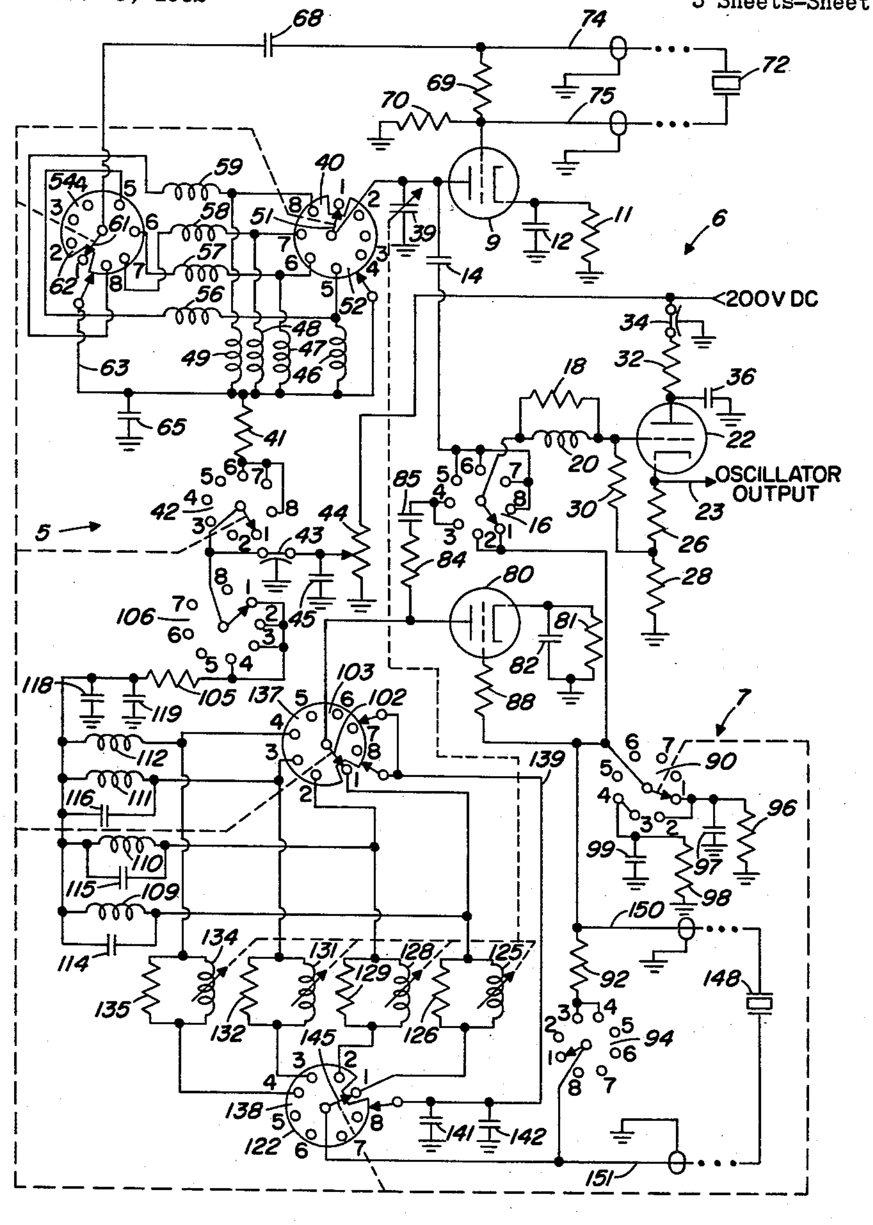

This invention relates to a crystal oscillator and more particularly to an oscillator having a remotely situated crystal that is connected to the remainder of the circuitry by means of a pair of one-half wavelength coaxial cables.

It sometimes becomes necessary to locate the crystal of a crystal oscillator at a distance from the remainder of the oscillator circuitry. Such might be the case, for example, where the crystal is to be tested for frequency deviation under vibration conditions or where the crystal is to be maintained at constant temperature in an oven or the like.

In addition, it is also frequently desirable to have a single oscillator unit that can produce an output signal of any frequency (as determined by the crystal connected to the unit) over a broad range of frequencies.

While crystal oscillators are known that include transmission lines to connect a crystal to the remainder of the oscillator circuitry, these known oscillators have not fully solved the problem of providing an oscillator unit that can be used with any one of a plurality of crystals over a broad range of frequencies. In addition, no known oscillator circuit is capable of operation with a crystal having a resistance much larger than the characteristic impedance of the transmission line connecting the crystal to the remainder of the oscillator circuitry.

It is a feature of this invention that an oscillator unit is provided that is capable of use with crystals over a broad range of frequencies. It is another feature of this invention that each crystal is remotely situated with respect to the remainder of the oscillator circuitry and is connected thereto by means of a pair of substantially one-half wavelength (or multiples thereof) coaxial cables.

It is therefore an object of this invention to provide a crystal oscillator capable of utilization over a broad range of frequencies.

It is another object of this invention to provide an oscillator having a remotely situated crystal connected to the remainder of the oscillator circuitry by means of coaxial cables that have a length substantially equal to $n/2$ wavelengths with respect to the frequency of said crystal, where $n$ is a positive integer.

More particularly, it is an object of this invention to provide a crystal oscillator having a remotely situated crystal connected by means of substantially one-half wavelength (or multiples thereof) coaxial cables to the remainder of the oscillator circuitry whereby said oscillator may be utilized with crystals having much greater resistance than the characteristic impedance of said cables.

With these and other objects in view which will become apparent to one skilled in the art as the description proceeds, this invention resides in the novel construction, combination and arrangement of parts substantially as hereinafter described and more particularly defined by the appended claims, it being understood that such changes in the precise embodiment of the herein disclosed invention may be included as come within the scope of the claims.

Figure 2:
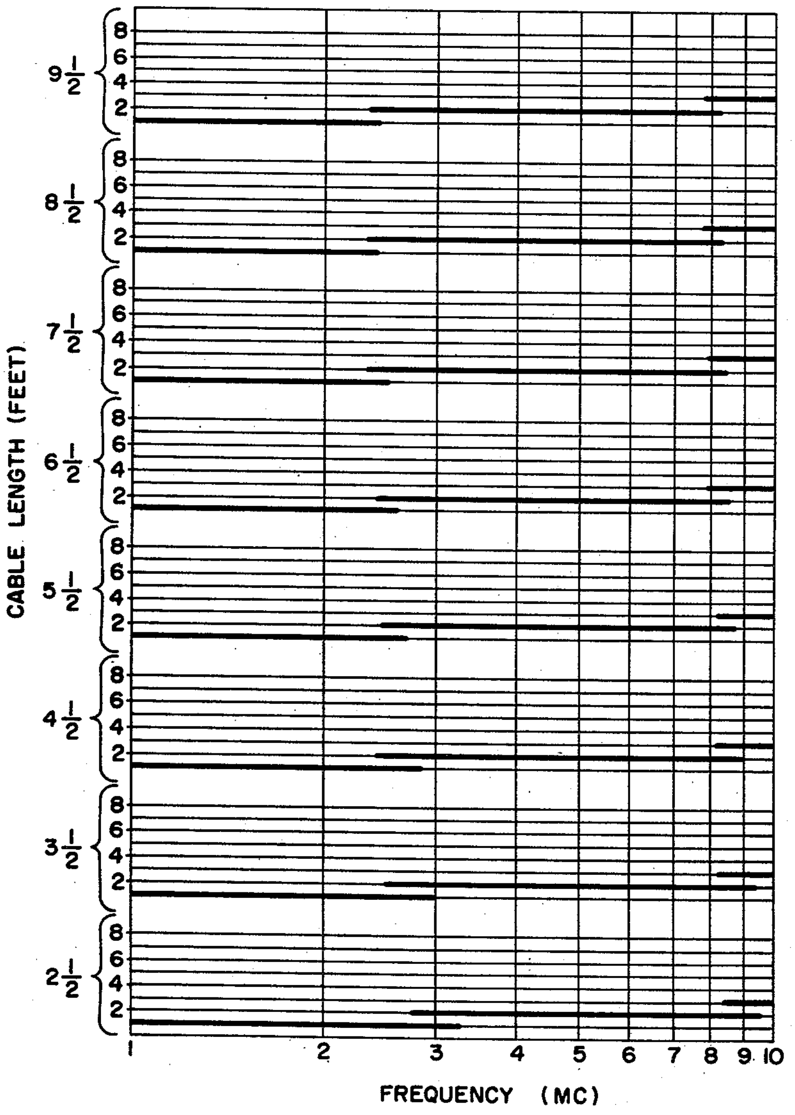
Figure 3:
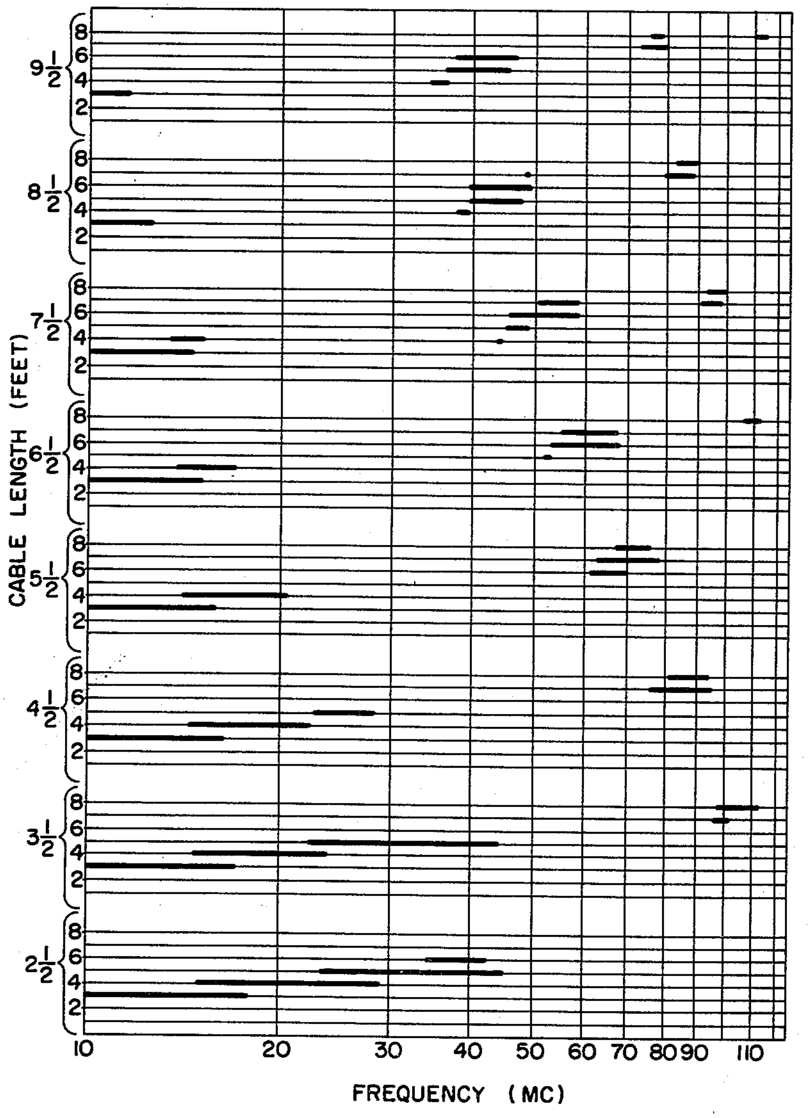

The accompanying drawings illustrate one complete example of the embodiment of the invention constructed according to the best mode so far devised for the practical application of the principles thereof, and in which:

FIGURE 1 is a schematic diagram of an oscillator having a remotely situated crystal according to the invention; and FIGURES 2 and 3 are charts illustrating the length of cable needed for each band to cover a specific portion of a broad range of frequencies.

Referring now to the drawings, FIGURE 1 shows an oscillator unit 5 that may be utilized with any crystal having a frequency between 1 and 110 megacycles. Each said crystal is connected to unit 5, but remotely situated with respect thereto, by means of a pair of coaxial cables substantially equal to one-half wavelength with respect to the crystal frequency.

As shown in the drawing, oscillator unit 5 consists of a very high frequency (VHF) (30–110 megacycles) section 6 and a high frequency (HF) (1–30 megacycles) section 7. The frequency of the crystal determines, of course, whether the crystal is utilized with the HF section or the VHF section.

The frequency range covered (here considered to be 1 megacycle to 110 megacycles) is divided into bands of frequencies since the associated oscillator circuitry must provide the necessary 180° phase shift. As shown in the drawing, eight bands are utilized, although it is to be appreciated, of course, that any number of bands might be used as are needed to conveniently break the frequency range into acceptably small portions to achieve the desired end over the entire frequency range.

Referring to the VHF section 6, an amplifier tube 9, shown herein as a conventional triode, is provided. The cathode of tube 9 is connected to ground through a resistor 11 and a capacitor 12. The plate of amplifier 9 is connected through a blocking capacitor 14 to stationary contacts, or pins, 5, 6, 7 and 8 of multiposition switch 16. Multiposition switch 16 has a single contact rotor that is connected through parallel connected resistor 18 and inductor 20 to the grid of conventional cathode follower tube 22.

As is conventional, the oscillator output is taken from the cathode of cathode follower 22, as at lead 23. The cathode is also connected to ground through series connected resistors 26 and 28, the junction of which resistors is connected to the control grid through resistor 30. The plate of cathode follower 22 is connected to a 200 volt power supply (not shown) through resistor 32 and feedthrough capacitor 34. In addition, the plate is connected with ground through capacitor 36.

The plate of amplifier tube 9 is connected with ground through a variable capacitor 39, and to the 200 volt power supply, when the VHF section is energized, through multiposition switch 40, resistor 41, an inductor (as brought out hereinbelow), multiposition switch 42, feedthrough capacitor 43, and variable resistor 44. A bypass capacitor 45 is also provided between capacitor 43 and resistor 44.

Inductors 46, 47, 48 and 49 are connected to pins 5 through 8, respectively, of multiposition switch 40 and the power supply must pass through one of the inductors to reach the plate of tube 9. Thus the VHF section is energized in four positions (5 through 8) of the multiposition switches, all of which are constrained to common rotation and may be mounted on a single shaft (not shown) as is conventional.

Switch 40 has a single contact rotor 51 connected to the plate of tube 9 and a single notched rotor 52 that is insulated from rotor 51 and makes contact with all of the stationary contacts except the one contacted by rotor 51.

The feedback network from the plate to the control grid of amplifier 9 is through multiposition switches 40 and 54, each of which has an inductor connected between like pins. Pin 5 of each is connected through inductor 56, pin 6 of each is connected through inductor 57, pin 7 of each is connected through inductor 58, and pin 8 of each is connected through inductor 59. Inductors 46–49, inductors 56–59 and variable capacitor 39 form a phase shift network, only one inductor from each group being connected in the network at any one time as determined by the setting of multiposition switches 40 and 54.

Multiposition switch 54, like switch 40, has a one contact rotor 61 and a single notch rotor 62. Rotor 62 is connected to rotor 52 of switch 40 through lead 63, which lead is connected to the junction of inductors 46–49 and resistor 41. Lead 63 also has a bypass capacitor 65 to ground.

Rotor 61 of multiposition switch 54 is connected through capacitor 68 to one side of resistor 69, the other side of which is connected to the control grid of amplifier 9. The control grid also has a return to ground through resistor 70.

The crystal 72 to be connected from the remote location (if the crystal frequency is in the VHF range) is placed in parallel across resistor 69 so that one side of the crystal is connected to the control grid and the other to the phase shifting network. As indicated in FIGURE 1, the crystal is connected into the circuit by a pair of coaxial cables 74 and 75, each of which has the outer conductor grounded.

The length of coaxial cables 74 and 75 is dependent upon the frequency of the crystal selected. The length, however, must be substantially one-half wavelength, or multiples thereof, with respect to the frequency of the selected crystal. By utilizing this length of cable, a high impedance is presented at each side of the crystal. This permits utilization of crystals having a resistance much larger than the characteristic impedance of the coaxial cables.

The chart of FIGURES 2 and 3 may be referred to in ascertaining the length of cable needed for a particular frequency as well as the band setting of the multiposition switches. As shown in this chart, whenever a horizontal line crosses a given frequency the length of cable and the band (as shown at the left of the chart) may properly be used for that frequency.

HF section 7 is similar to VHF section 6, although the components are chosen, of course, to satisfy the lower frequency conditions. Amplifier tube 80 has a cathode that is connected to ground through parallel connected resistor 81 and capacitor 82 and an output taken from the plate through resistor 84 and capacitor 85 to stationary contacts 3 and 4 of multiposition switch 16, the rotor of which, as brought out hereinabove, is connected to the oscillator output through cathode follower 22.

As shown, contacts 1 and 2 of multiposition switch 16 are connected to the control grid of amplifier 80 through resistor 88 to the rotor of multiposition switch 90, and through resistor 92 to contacts 3 and 4 of multiposition switch 94. Pins 1 and 2 of switch 90 are connected to ground through resistor 96 and capacitor 97, while pins 3 and 4 are connected to ground through resistor 98 and capacitor 99.

The plate of amplifier 80 is also connected to the single contact rotor 102 of multiposition switch 103 and is connected to the 200 volt power supply through switch 103, resistor 105, multiposition switch 106, feedthrough capacitor 43 and variable resistor 44. In addition, the power also passes through the inductor connected to each of the first four pins of switch 103. As shown, inductor 109 is connected to pin 1 of switch 103, inductor 110 is connected to pin 2, inductor 111 is connected to pin 3, and inductor 112 is connected to pin 4. Inductors 109, 110 and 111 also have capacitors 114, 115 and 116 connected in parallel therewith, while bypass capacitors 118 and 119 are provided between the junction of inductors 109–112 and resistor 105.

A phase shifting network is provided between multiposition switch 103 and multiposition switch 122. This phase shifting network includes the inductors and capacitors 109–116, above referred to, and also includes a serially connected circuit between like pins of switches 103 and 122. As shown, pin 1 of each switch is connected to parallel connected variable inductor 125 and resistor 126, pin 2 of each switch is connected to parallel connected variable inductor 128 and resistor 129, pin 3 of each switch is connected to parallel connected variable inductor 131 and resistor 132, and pin 4 of each switch is connected to parallel connected variable inductor 134 and resistor 135.

Multiposition switch 103 also has a single notch rotor 137 identical to that of switches 40 and 54. Like switch 103, switch 122 also has a single notch rotor 138, and this rotor is directly connected by means of lead 139 to single notch rotor 137 of switch 103. Lead 139 also has a pair of capacitors 141 and 142 to ground.

The single contact rotor 145 of multiposition switch 122 is connected to the rotor of multiposition switch 94. However, since only pins 3 and 4 are connected to resistor 92, this resistor is in the circuit only in positions 3 and 4.

When a crystal 148 in the HF frequency region is used, the crystal is connected across resistor 92 in the same manner as described hereinabove with respect to crystal 72. When resistor 92 is not in the circuit, however, then the crystal alone is connected between the phase shifting network and resistor 88 (to the control grid of amplifier 80).

Crystal 148 is connected to HF section 7 by means of coaxial cables 150 and 151 in the same manner as crystal 72 is connected to VHF section 6, the length of the cables varying with the frequency of crystal 148, as shown in the chart of FIGURES 2 and 3, so that the cables are maintained substantially at one-half wavelength (or multiples thereof) with respect to the crystal frequency. As indicated in the drawing, the outer conductors of coaxial cables 150 and 151 are grounded while the inner conductors connect the crystal to the unit. At the lower frequencies, it is possible to utilize the coaxial cables as part of the phase shift network, and to do so, these cables may, if desired, be selected to have a length somewhat less than one-half wavelength as would be necessary to give the desired phase shift at a particular frequency. This however, is not desirable, at least to any great extent, at higher frequencies.

In operation, a crystal may be chosen that is in either the high frequency or very high frequency range. If in the VHF range, the crystal is connected to the VHF section 6 by means of a pair of equal length cable substantially one-half wavelength with respect to the crystal frequency. This length may be quickly ascertained by the chart of FIGURES 2 and 3. The multiposition switches are then rotated and the band of frequencies that includes the crystal frequency is selected, which band is also given by the chart of FIGURE 2. The proper section of the oscillator unit will then be energized and the desired output frequency thereafter produced, the required 180° phase shift between the plate and grid of the amplifier being provided by the phase shift network, the coaxial cables (if off of frequency of crystal at all by virtue of the length not being exactly a half wavelength or multiple thereof) and the resistance of the crystal.

As shown in the drawing, eight bands of frequencies have been utilized to cover a frequency range of 1 to 110 megacycles. Although the bands can be varied, as would be obvious to one skilled in the art, the bands might be selected as follows:

| | Megacycles |
|---|---|
| Band 1 | 1 to 3 |
| Band 2 | 3 to 10 |
| Band 3 | 10 to 18 |
| Band 4 | 18 to 30 |
| Band 5 | 30 to 40 |
| Band 6 | 40 to 60 |
| Band 7 | 60 to 85 |
| Band 8 | 85 to 110 |

In view of the foregoing, it should be evident to those skilled in the art that the novel oscillator of this invention is capable of being used with crystals that vary in frequency over a broad range of frequencies and which may be remotely situated with respect to the remainder of the oscillator circuitry, said crystals being connected thereto by means of coaxial cables of substantially one-half wavelength.

What is claimed as our invention is:

1. A crystal oscillator wherein said crystal is remotely situated with respect to the remainder of the circuitry, said oscillator comprising: an amplifier including a control electrode and an output electrode; phase shifting means connected to one of said electrodes; a crystal remotely situated with respect to said amplifier; and first and second transmission lines one of which has one end portion connected to one side of said crystal and the other end portion connected to the other of said electrodes and the other of which lines has one end portion connected to the other side of said crystal and the other end portion connected to said phase shifting means, said transmission lines being of a length so as to be substantially $n/2$ wavelengths with respect to the frequency of said crystal, where $n$ is a positive integer; said phase shifting means, said transmission lines and the resistance of said crystal providing a 180° phase shift between said output electrode and said control electrode.

2. A crystal oscillator wherein said crystal is remotely situated with respect to the remainder of the circuitry, said oscillator comprising: an amplifying tube having a plate, a control grid and a cathode, said cathode being connected with ground; phase shifting means connected to said plate; a crystal remotely situated with respect to said amplifying tube; a first coaxial cable the inner conductor of which is connected at one end to one side of said crystal and at the other to said phase shifting means; and a second coaxial cable the inner conductor of which is connected at one end to the other side of said crystal and at the other end to said control grid; said coaxial cables having grounded outer conductors and being substantially $n/2$ wavelengths with respect to the frequency of said crystal, where $n$ is a positive integer; said phase shifting means, said coaxial cables and the resistance of said crystal providing a 180° phase shift between said plate and said grid.

3. A crystal oscillator capable of being utilized with any crystal within a broad range of frequencies and wherein said crystal is remotely situated with respect to the remainder of the circuitry, said oscillator comprising: a crystal; an amplifier including a control electrode and an output electrode; a plurality of phase shifting means; means for selectively connecting one of said phase shifting means to one of said electrodes; and first and second transmission lines one of which has one end portion connected to one side of said crystal and the other end connected to said phase shifting means selected, and the other of which lines has one end portion connected to the other side of said crystal and the other end portion connected to the other said electrode, the length of said transmission lines being chosen so as to be substantially $n/2$ wavelengths with respect to frequency of said crystal, when $n$ is a positive integer; said phase shifting means selected being dependent upon the frequency of said crystal so that phase shifting means selected, said transmission lines and the resistance of said crystal provide a 180° phase shift between said output electrode and said control electrode.

4. A crystal oscillator capable of being utilized with any crystal within a broad range of frequencies and wherein said crystal is remotely situated with respect to the remainder of the circuitry, said oscillator comprising: a crystal; a high frequency amplifier and a very high frequency amplifier each of which includes a control electrode and an output electrode; a plurality of phase shifting networks; means for connecting one of said phase shifting networks to one said electrode of one said amplifier, said amplifier selected being dependent upon the frequency of said crystal; a first coaxial cable the inner conductor of which has one end portion connected to one side of said crystal and the other end portion connected to said phase shifting network selected; and a second coaxial cable the inner conductor of which has one end portion connected to the other side of said crystal and the other end portion connected to the other said electrode of said amplifier selected; the outer conductors of said coaxial cables being connected to ground; the length of said coaxial cables being varied so as to always have a length substantially equal to $n/2$ wavelengths with respect to the frequency of said crystal, where $n$ is a positive integer; said phase shifting network selected being dependent upon the frequency of said crystal so that said phase shifting network selected, said coaxial cables and the resistance of said crystal provide a 180° phase shift between said output electrode and said control electrode.

References Cited by the Examiner

UNITED STATES PATENTS

| | | | |
|---|---|---|---|
| 2,272,851 | 2/42 | Ramsay | 331—101 |
| 2,683,810 | 7/54 | Mortley | 331—158 |

ROY LAKE, *Primary Examiner.*

JOHN KOMINSKI, *Examiner.*